US010973161B2

(12) United States Patent
Williams et al.

(10) Patent No.: US 10,973,161 B2
(45) Date of Patent: Apr. 6, 2021

(54) ELECTRONIC COMPONENT REMOVAL DEVICE

(71) Applicant: Raytheon Company, Waltham, MA (US)

(72) Inventors: Brad S. Williams, Mckinney, TX (US); Yoram Baxter, Richardson, TX (US); Marco Ordonez, Richardson, TX (US); Bill Steadman, Richardson, TX (US)

(73) Assignee: Raytheon Company, Waltham, MA (US)

( * ) Notice: Subject to any disclaimer, the term of this patent is extended or adjusted under 35 U.S.C. 154(b) by 454 days.

(21) Appl. No.: 15/406,491

(22) Filed: Jan. 13, 2017

(65) Prior Publication Data

US 2018/0206371 A1 Jul. 19, 2018

(51) Int. Cl.
*H05K 13/04* (2006.01)
*B24B 27/06* (2006.01)
(Continued)

(52) U.S. Cl.
CPC ..... *H05K 13/0491* (2013.01); *B23D 57/0007* (2013.01); *B23D 57/0053* (2013.01);
(Continued)

(58) Field of Classification Search
CPC ........... H05K 13/0486; H05K 13/0491; H05K 2203/176; H01L 24/98; B23D 59/001;
(Continued)

(56) References Cited

U.S. PATENT DOCUMENTS

| 5,052,366 A | * | 10/1991 | Matsukura | ......... | B23D 57/0069 |
| | | | | | 125/16.01 |
| 6,237,585 B1 | * | 5/2001 | Oishi | ................. | B23D 57/0069 |
| | | | | | 125/16.02 |

(Continued)

FOREIGN PATENT DOCUMENTS

| CN | 101312136 A | 11/2008 |
| CN | 100459086 C | 2/2009 |

(Continued)

OTHER PUBLICATIONS

IBM Corp., Self-clamping, self-aligning probe for torsional chip removal, IBM Technical Disclosure Bulletin, Jun. 1990, vol. 33, No. 1B, IBM Corp., Armonk, New York.

(Continued)

*Primary Examiner* — A. Dexter Tugbang

(57) ABSTRACT

An electronic component removal device comprising a cutting wire routed through a cutting region configured to receive an electronic component coupled to a substrate. The electronic component removal device can also include a leading actuator coupled to a leading end of the cutting wire to cause movement of the cutting wire in a cutting direction at a cutting speed. The electronic component removal device can further include a trailing resistance device coupled to a trailing end of the cutting wire to resist movement of the cutting wire in the cutting direction with a variable resistance. In addition, the electronic component removal device can include a leading tension sensor to sense a leading tension in the cutting wire between the cutting region and the leading actuator. The trailing resistance device can resist movement of the cutting wire with a resistance that varies based on the leading tension in the cutting wire.

16 Claims, 7 Drawing Sheets

(51) Int. Cl.
*B23D 59/00* (2006.01)
*H01L 23/00* (2006.01)
*B23D 57/00* (2006.01)
*G01R 31/28* (2006.01)

(52) U.S. Cl.
CPC ....... *B23D 57/0069* (2013.01); *B23D 59/001* (2013.01); *B24B 27/0633* (2013.01); *B24B 27/0691* (2013.01); *H01L 24/98* (2013.01); *H05K 13/0486* (2013.01); *B23D 57/0061* (2013.01); *B23D 59/002* (2013.01); *G01R 31/2886* (2013.01); *H05K 2203/176* (2013.01)

(58) Field of Classification Search
CPC ............ B23D 57/0007; B23D 57/0053; B23D 57/0061; B23D 57/0069; B23D 59/002; G01R 31/2886; B24B 27/0633; B24B 27/0691
See application file for complete search history.

(56) References Cited

U.S. PATENT DOCUMENTS

| | | | |
|---|---|---|---|
| 6,239,481 B1 | 5/2001 | Dischiano | |
| 6,347,734 B1 | 2/2002 | Downes | |
| 6,539,618 B1 | 4/2003 | Lyke | |
| 6,719,188 B2 | 4/2004 | Farooq et al. | |
| 7,503,831 B2 * | 3/2009 | Radkevich | B23D 57/0061 125/16.02 |
| 2003/0019918 A1 | 1/2003 | Farooq et al. | |
| 2006/0139042 A1 * | 6/2006 | Kasukabe | G01R 31/2886 324/754.15 |
| 2009/0320658 A1 * | 12/2009 | Yazawa | B23D 57/0007 83/13 |
| 2010/0218842 A1 * | 9/2010 | Glinski | B23D 57/0053 140/92.1 |
| 2012/0298090 A1 * | 11/2012 | Ohya | B23D 57/0069 125/16.02 |
| 2012/0298091 A1 * | 11/2012 | Hoshiyama | B23D 57/0069 125/16.02 |

FOREIGN PATENT DOCUMENTS

| | | |
|---|---|---|
| CN | 101494181 B | 10/2010 |
| JP | 55077973 A * | 6/1980 |
| JP | S59-61197 A | 4/1984 |
| JP | 3054550 B2 | 6/2000 |
| JP | 2008036766 A | 2/2008 |
| TW | 201009968 A | 3/2010 |

OTHER PUBLICATIONS

International Search Report for International Application No. PCT/US2017/057370 dated May 9, 2018, 28 pages.
Cao, Research on Cutting Technology of Underwater Diamond Wire Saw, IEEE, Sep. 2008, pp. 2751-2756; China.
South Bay Technology Inc.; Precision Cutting BGA Packages for Ball Bond Integrity Testing; http://www.southbaytech.com/appnotes/15%20Precision%20Cutting%20BGA%20Packages%20for%20Ball%20Bond%20Integrity%20Testing.PDF; as accessed Jan. 13, 2017, applicant believes article was available before application filed; 2 pages; San Clemente, California.
Invitation to Pay Additional Fees for International Application No. PCT/US2017/057370 dated Feb. 13, 2018, 14 pages.

* cited by examiner

ELECTRONIC COMPONENT REMOVAL DEVICE

BACKGROUND

Electronic components, such as chips and dies, are often attached to substrates (e.g., circuit boards) with solder balls in a configuration commonly known as a ball grid array (BGA). When an electronic device fails, it may be removed from a substrate and replaced. Current industry removal technology utilizes super-heated gases directed onto a top portion of a chip with masking and shielding to focus the applied heat. An alternative process uses an end mill to mill through a chip to the underlying solder balls.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1:
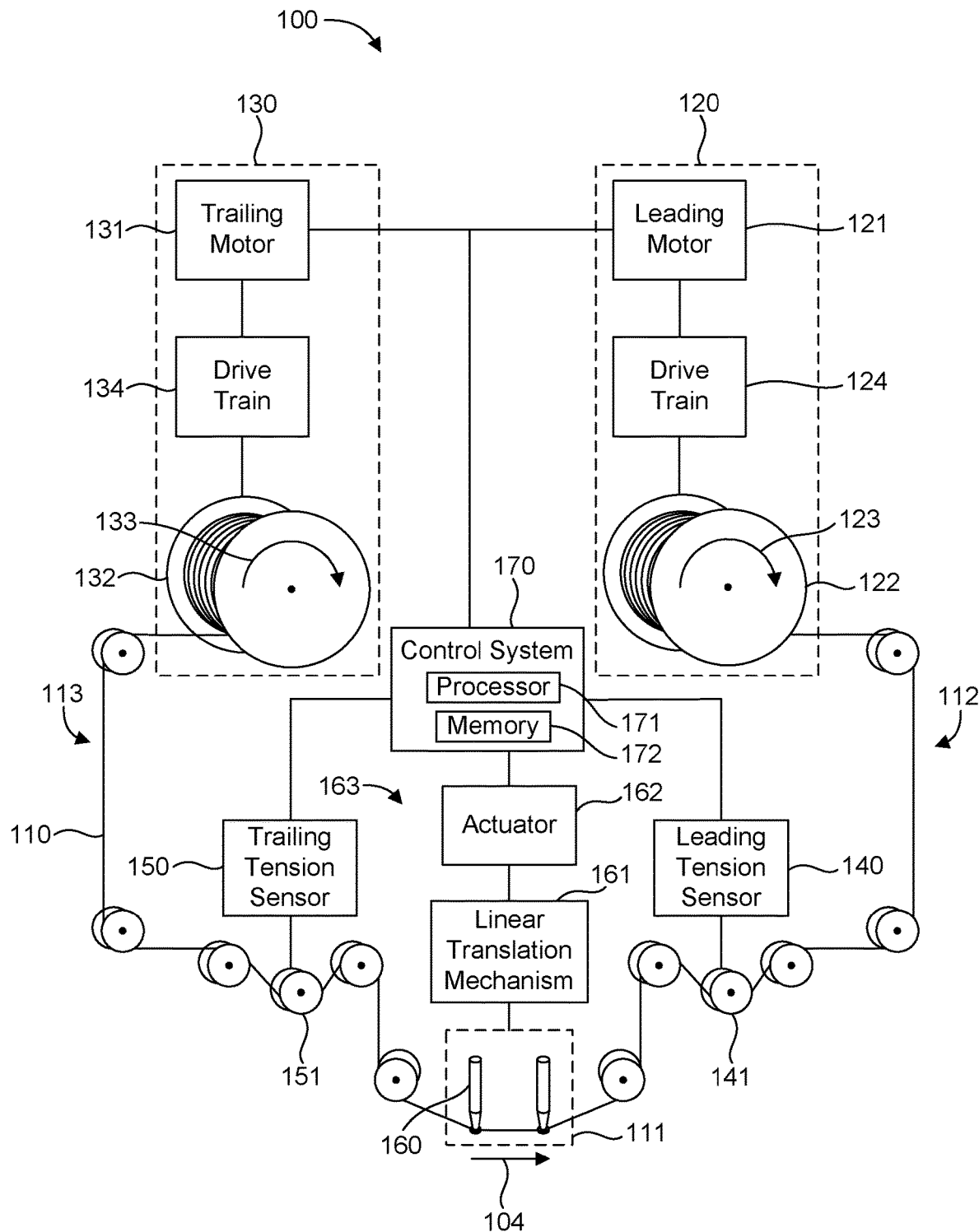
FIG. 1 is a schematic illustration of an electronic component removal device in accordance with an example of the present disclosure.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of the inventive concepts is provided below and then specific examples are described in further detail later. This initial summary is intended to aid readers in understanding the examples more quickly, but is not intended to identify key features or essential features of the examples, nor is it intended to limit the scope of the claimed subject matter.

Although super-heated gases and milling may effectively remove electronic components from substrates, such techniques typically destroy the electronic components and may impart collateral damage to nearby components and substrates. This puts functional components at risk and often destroys the failure evidence of the faulty component. Indeed, in many cases it is desirable to preserve the failed electronic component for inspection and analysis to determine the cause of the failure and improve future designs. In addition, applying super-heated gases requires highly trained technicians and is a labor intensive, lengthy and expensive process.

Accordingly, disclosed herein is an electronic component removal device that removes electronic components without damage to the parent assembly and retains failure evidence. In one aspect, the electronic component removal device can include a cutting wire routed through a cutting region configured to receive an electronic component coupled to a substrate. The electronic component removal device can also include a leading actuator coupled to a leading end of the cutting wire to cause movement of the cutting wire in a cutting direction at a cutting speed. The electronic component removal device can further include a trailing resistance device coupled to a trailing end of the cutting wire to resist movement of the cutting wire in the cutting direction with a variable resistance. In addition, the electronic component removal device can include a leading tension sensor to sense a leading tension in the cutting wire between the cutting region and the leading actuator. The trailing resistance device can resist movement of the cutting wire with a resistance that varies based on the leading tension in the cutting wire. It is noted that use of the electronic component removal device can be automated.

An electronic component retainer is also disclosed. The electronic component retainer can include first and second interface portions to interface with opposite ends of an electronic component. Each interface portion can have a vertical interface surface to interface with a side surface of the electronic component, and a horizontal interface surface to interface with a top surface of the electronic component. The electronic component retainer can also include at least one support coupled to the first and second interface portions to constrain horizontal and vertical movement of the electronic component during removal of the electronic component from a substrate.

One embodiment of an electronic component removal device 100 is schematically illustrated in FIG. 1. The electronic component removal device 100 can be generally described as a precision wire saw. As described in more detail below, the electronic component removal device 100 can include an automated closed loop feedback system that dynamically controls cutting wire tension and cutting speed to remove electronic components from substrates (e.g., circuit boards) with minimal risk of cutting wire breakage or damage to the substrate and its components, thus maintaining failure evidence so that future products can be improved from the analysis of the removed component.

Figure 2:
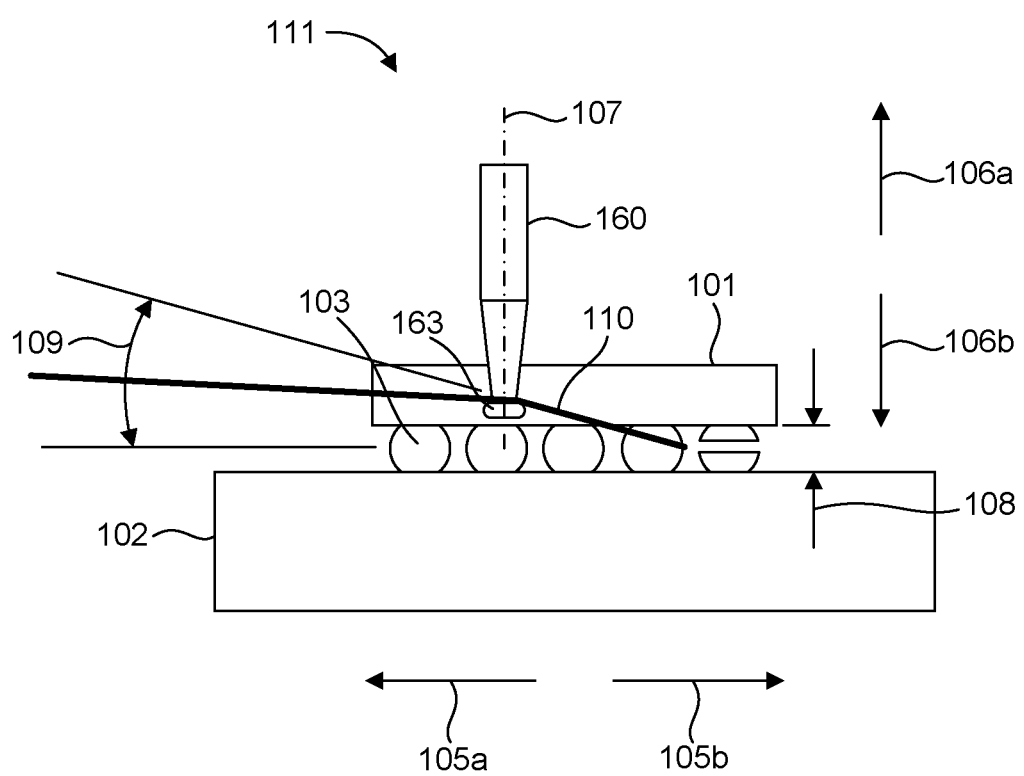
FIG. 2 is a detailed side view of a cutting region of an electronic component removal device showing an electronic component and a substrate.

As a type of wire saw, the electronic component removal device 100 can include a cutting wire 110. The cutting wire 110 can be of any suitable type or size for removing an electronic component from a substrate. In one example, the cutting wire 110 can comprise a diamond abrasive. The cutting wire 110 can be routed through a system of bearings or pulleys and through a cutting region 111. A detailed side view of the cutting region 111 is shown in FIG. 2. The cutting region 111 can be configured to receive an electronic component 101 (e.g., a chip, die, package, etc.) coupled to a substrate 102 (e.g., a PCB), such as by solder balls 103 or other attachment material, as shown in FIG. 2. Electronic components may be perimeter bonded, underfilled, or non-underfilled components. The electronic component 101 and substrate 102 are omitted from FIG. 1 for clarity.

With reference to FIGS. 1 and 2, the electronic component removal device 100 can include a leading actuator 120 coupled to a leading end 112 of the cutting wire 110 to cause movement of the cutting wire 110 in a cutting direction 104. The electronic component removal device 100 can also include a trailing resistance device 130 coupled to a trailing end 113 of the cutting wire 110 to resist movement of the cutting wire 110 in the cutting direction 104. The terms "leading" and "trailing" as used herein refer to the functional position of components and features relative to the cutting region 111 with respect to the cutting direction 104. In particular, "leading" refers to components or features that are functionally positioned in the cutting direction 104 relative to the cutting region 111, and "trailing" refers to components or features that are functionally positioned opposite the cutting direction 104 relative to the cutting region 111. Thus, for example, the leading actuator 120 pulls the cutting wire 110 from the trailing resistance device 130 in the cutting direction 104 through the cutting region 111.

The leading actuator 120 can cause movement of the cutting wire 110 in in any suitable manner. For example, in some embodiments, as illustrated in FIG. 1, the leading actuator 120 can include a leading motor 121 operably coupled to a take-up spool 122 to cause the cutting wire 110 to wind around the take-up spool 122, such as by rotating the take-up spool 122 in direction 123. Similarly, the trailing resistance device 130 can apply resistance in any suitable manner. For example, in some embodiments, the trailing resistance device 130 can include a trailing motor 131 operably coupled to a feed spool 132 to resist the cutting wire 110 unwinding from the feed spool 132, such as by applying a back-torque opposite a rotation direction 133 of the feed spool 132 to resist the cutting wire 110 being pulled from the feed spool 132 by the leading actuator 120. In another example, the trailing resistance device 130 can comprise a braking mechanism operably coupled to the feed spool 132 that is able to apply a braking force to resist the cutting wire 110 unwinding from the feed spool 132. In the illustrated embodiment, the electronic component removal device 100 includes a single cutting wire 110 that moves from reel-to-reel. The cutting wire 110 may only be used a single time and discarded. In other embodiments, a cutting wire can form a continuous loop and may be used multiple times prior to being discarded.

The leading actuator 120 and the trailing resistance device 130 may be independently controlled and in different manners to control cutting wire tension. For example, the leading actuator 120 (e.g., the leading motor 121) can be controlled through a velocity command, and the trailing resistance device 130 (e.g., the trailing motor 131) can be controlled through a back-force or back-torque command. Thus, the leading actuator 120 can be dynamically controlled to maintain a desired speed or speed range, and the trailing resistance device 130 can be dynamically controlled to provide resistance to maintain consistent tension (e.g., a desired range of tension) in the cutting wire 110, which is described in more detail below.

Any suitable motor can be utilized for the leading and trailing motors 121, 131, such as A/C or D/C electric motors (e.g., brushed or brushless DIG motors). In some embodiments, drive trains 124, 134 can be included to couple the leading and trailing motors 121, 131 and the respective take-up and feed spools 122, 132. In one aspect, the drive train 124 and/or the drive train 134 can incorporate gear reduction so that very minute changes to cutting wire speed and/or tension can be made with relatively large changes being made in speed or torque by the motors. In other words, relatively large changes can be made to the motors (e.g., using digital pulse-width modulation) without the changes being translated directly to the cutting line, which can improve cutting wire speed and tension control as well as feedback accuracy. Thus, gear reduction from the motors allows precise control of cutting wire velocity or tension at any desired motor speed.

The electronic component removal device 100 can include tension sensors to facilitate real-time monitoring of cutting wire tension. For example, the electronic component removal device 100 can include a leading tension sensor 140 to sense a leading tension in the cutting wire 110 between the cutting region 111 and the leading actuator 120. In some embodiments, the electronic component removal device 100 can also include a trailing tension sensor 150 to sense a trailing tension in the cutting wire 110 between the cutting region 111 and the trailing resistance device 130. Any suitable tension sensor can be utilized for the leading and trailing tension sensors 140, 150. For example, the tension sensors 140, 150 can include suitable force sensors, such as load cells (e.g., S-type load cells), that are acted on by the cutting wire 110 in contact with movable pulleys or wire guides 141, 151. Other types of sensors are contemplated herein, as will be recognized by those skilled in the art.

As described in more detail below, the leading and trailing tension sensors 140, 150 can independently monitor cutting wire tension in real-time. Cutting through the solder balls 103 creates a very dynamic cutting wire friction and tension environment. Tension feedback enables the electronic component removal device 100 to function in an effective, controlled manner to ensure no tension spikes occur that could lead to cutting wire failure or low tension conditions that could cause the cutting wire to leave the routing path. Tension data can be used to automatically and dynamically adjust motor inputs (e.g., speed for the leading motor 121 and back-torque for the trailing motor 131) to maintain cutting speed and wire tension within acceptable limits. For example, the leading tension sensor 140 can be used as the primary sensor for maintaining a desired or consistent cutting wire tension (e.g., through application of resistance on the cutting wire 110 by the trailing resistance device 130), and the trailing tension sensor 150 can be used to monitor for grossly anomalous conditions, such as binding, line breakage, or sudden loss in tension due to other system malfunction.

The electronic component removal device 100 can include guide rods 160 to route the cutting wire 110 through the cutting region 111. In one aspect, the guide rods 160 can be configured to move relative to the electronic component 101 in order to advance the cutting wire 110 through the solder balls 103 or other material attaching the electronic component 101 to the substrate 102. For example, the electronic component removal device 100 can include a linear translation mechanism 161 operably coupled the guide rods 160 and/or the substrate 102 to cause relative movement of the cutting wire 110 and the electronic component 101 in an advancement direction 105a (e.g., horizontally) through a material (e.g., the solder balls 103) that couples the electronic component 101 to the substrate 102, or in an opposite retraction direction 105b (FIG. 2). Any suitable linear translation mechanism or device can be utilized, such as devices commonly known as linear translation stages, a movable rail coupled to a lead screw, etc. The linear translation mechanism 161 can be actuated or caused to move manually by an operator and/or by an advancement actuator 162. The linear translation mechanism 161 and the actuator 162 can be part of a feed system 163 for the cutting wire 110. Vertical height adjustment of the cutting wire 110 in directions 106a, 106b for vertically positioning a cut through attachment material can be made by moving the guide rods 160 vertically. The electronic component removal device 100 can optionally include a linear translation mechanism (and actuator) to vertically move and position the guide rods 160. In one aspect, the guide rods 160 can be supported by bearings or bushings to facilitate rotation of the guide rods 160 about a vertical axis 107 as the cutting wire 110 moves past the guide rods 160.

The cutting wire 110 can be advanced through the solder balls 103 by the feed system 163 in direction 105a in any suitable manner. For example, the feed system 163 can advance the cutting wire 110 in a linear feed sequentially through rows of solder balls 103, which may minimize the number of solder balls 103 in contact with the cutting wire 110 at a given time thereby minimizing friction, tension, and tension variability in the cutting wire 110 that may cause failure of the cutting wire 110. Actuated advancement of the cutting wire 110 through the solder balls 103 can enable the automatic retraction of the cutting wire 110 in direction 105b as another way to control cutting wire tension should the tension become excessive.

The cutting wire 110 can have a small diameter sized to fit between the electronic component 101 and the substrate 102 to cut the solder balls 103, which can facilitate nondestructive removal of the electronic component 101 from the substrate 102. For example, the cutting wire 110 can have a core diameter of from about 10% to about 30°/h of a gap 108 between the electronic component 101 and the substrate 102. In some embodiments, the cutting wire 110 can have a diameter of from about 0.070 mm to about 0.300 mm. Any suitable wire diameter can be selected as desired for a particular application.

The guide rods 160 can include a lip or flange 164 to support the cutting wire 110. The lip or flange 164 can have a small diameter and be vertically thin or low-profile to facilitate positioning the cutting wire 110 in the gap 108 between the electronic component 101 and the substrate 102. The guide rods 160 can also be laterally positioned relative to the electronic component 101 to minimize clearance between the guide rods 160 and the electronic component 101. Spacing between the guide rods 160 can be adjustable to accommodate different sizes of electronic components. The guide rods 160 can therefore be configured to facilitate use of the electronic component removal device 100 to remove a variety of small-scale electronics from compact or highly populated electronics assemblies.

In one aspect, the lip or flange 164 can support the cutting wire 110 while pulling the cutting wire 110 upward at a desired upward cutting angle 109 relative to horizontal or the top surface of the substrate 102 to manage or control the cutting wire position and avoid contract with the substrate 102. The cutting angle 109 can be achieved by vertically positioning the guide rods 160, as described above, such that the cutting wire 110 is pulled through the solder balls 103 at an upward angle. If the cutting wire 110 drifts too low during a cut, then the underlying substrate 102 can get damaged. If the cutting wire 110 drifts too high, then the electronic component 101 can get damaged. Pulling the cutting wire 110 through the cut at a suitable cutting angle 109 can cause the cutting wire 110 to self-align away from the substrate 102 (i.e., the cutting wire 110 is pulled away from the substrate 102). A suitable cutting angle 109 can maintain the cutting wire 110 cutting the solder balls 103 as opposed to allowing upward or downward drift that can damage the electronic component 101 or the substrate 102. The cutting angle 109 can also position the guide rods 160 and associated support structures (e.g., bearings) above the substrate 102 and in some cases entirely above the electronic component 101 for added clearance. A suitable cutting angle 109 may be from about 1 degree to about 20 degrees. More particularly, a suitable cutting angle 109 may be from about 5 degrees to about 15 degrees.

As alluded to above, the electronic component removal device 100 can include a control system 170 to process data from the tension sensors 140, 150 and control operation of the leading actuator 120, the trailing resistance device 130, and the feed system 163 to maintain cutting speed and cutting wire tension within acceptable parameters while removing the electronic component 101 from the substrate 102. The control system 170 can include any suitable hardware components, such as a processor 171 and memory 172, to control operation of the leading actuator 120, the trailing resistance device 130, and the feed system 163 as described herein, which may be governed by a control algorithm described below. The control system 170 can also include a microcontroller, amplifier, digital to analog converter, or any other suitable electronic component or hardware known in the art to facilitate communication and control of the various components of the electronic component removal device 100 as described herein. A user interface can also be included to receive user input for parameters such as cutting speed and tension limits.

Figure 3:
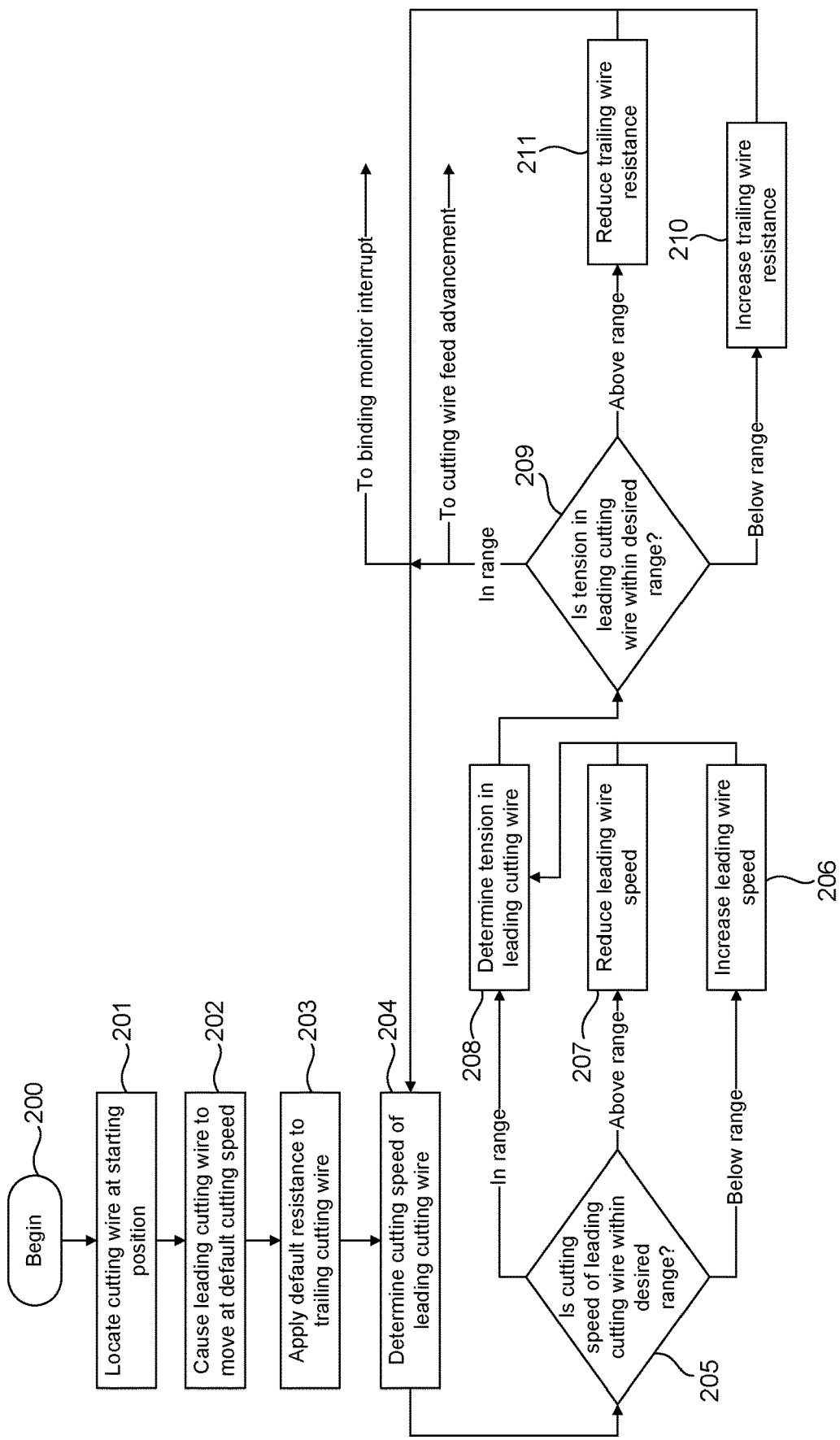
FIGS. 3-5 are flowcharts illustrating a control algorithm for removing an electronic component from a substrate in accordance with an example of the present disclosure.
Figure 4:
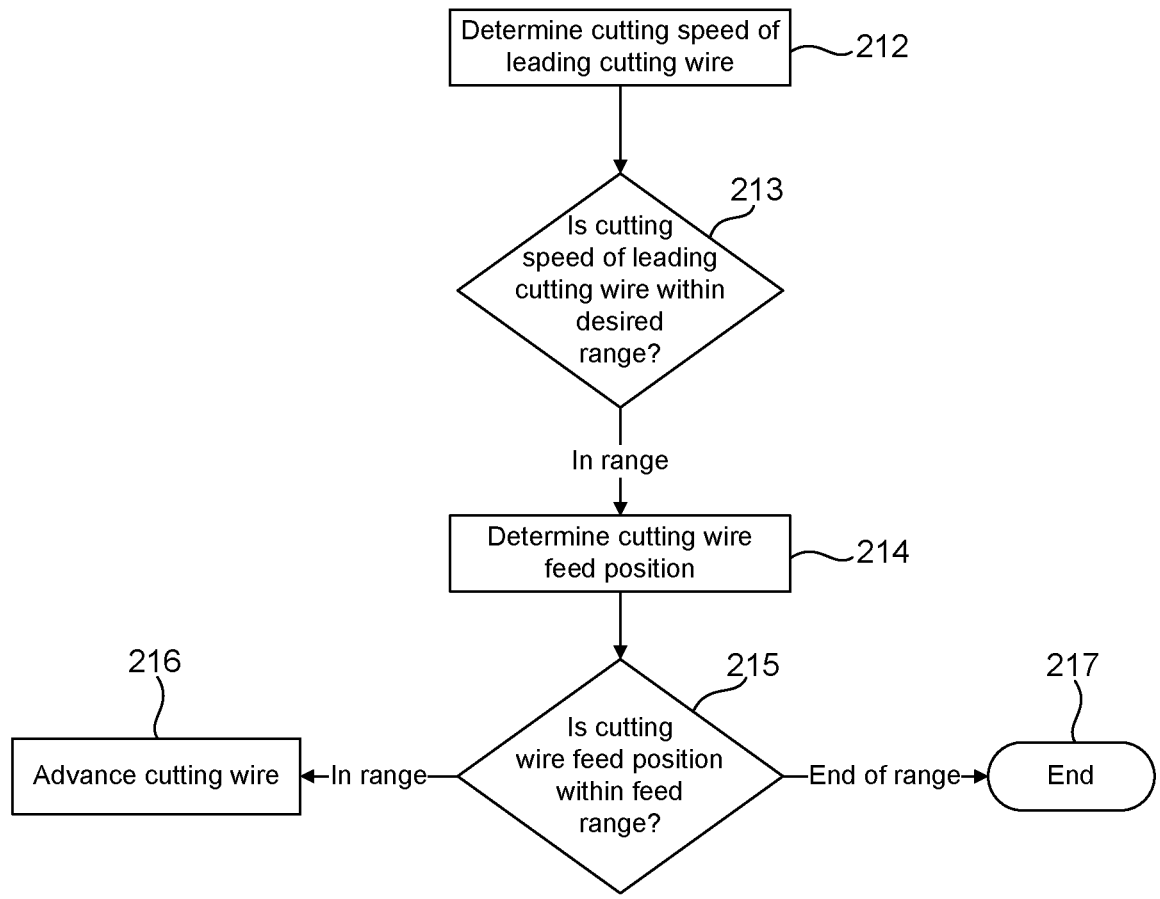
Figure 5:
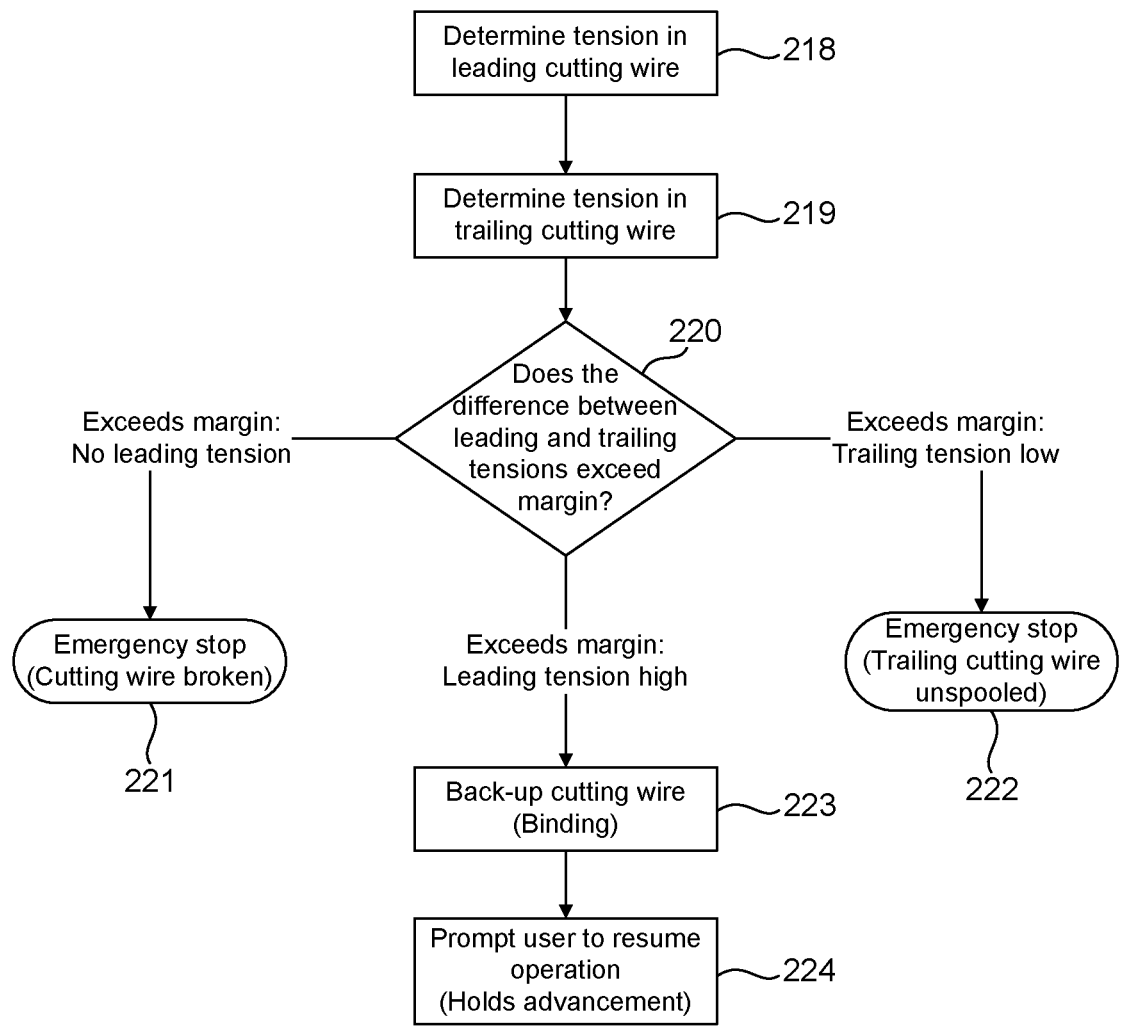

FIGS. 3-5 illustrate an algorithm for controlling operation of the electronic component removal device 100 to remove an electronic component from a substrate. With particular reference to FIG. 3, the algorithm begins at block 200. Blocks 201-203 address startup operations. These operations include locating the cutting wire at a starting position 201, causing the cutting wire to move at a default cutting speed 202, and applying a default resistance to the trailing cutting wire 203.

Blocks 204-210 concern the main control loop. Once startup operations are complete and at the beginning of every cycle of the main control loop, the cutting speed of the leading cutting wire is determined 204. The cutting speed can be assessed from data received from the leading motor 121, which may be pulling the cutting wire. The cutting speed of the cutting wire 110 may be in terms of inches or feet per second, which may be related to motor speed (e.g., RPM) that may be communicated as data in terms of voltage or resistance. The cutting speed is assessed with respect to a desired cutting speed range 205. In general, the thicker the cutting wire, the higher the allowable cutting speed. In one example, a cutting wire having a core diameter of 160 mm may have an allowable cutting speed range of from about 0.1 ft/s to about 20 ft/s.

If the cutting speed is below the desired cutting speed range, then the cutting speed is increased 206. If the cutting speed is above the desired cutting speed range, then the cutting speed is reduced 207. Such changes in cutting speed may occur incrementally to avoid rapid speed changes that may adversely affect friction and tension in the cutting wire. For example, the cutting speed may be adjusted by a percentage of the difference between a nominal or median value of the cutting speed range and the current cutting speed. Thus, cutting speed can be adjusted from about 5% to about 25% of the current difference in each cycle of the main control loop until the cutting speed is within the desired range. In this way, the leading actuator 120 can be actively controlled by speed feedback to maintain cutting speed within a desired range. In some embodiments, motor control software may have internal velocity loop control capabilities.

If the cutting speed is within the desired range or the cutting speed has been adjusted as described above, then the tension in the leading cutting wire 110 is determined 208. The tension in the leading cutting wire can be assessed from data received from the leading tension sensor 140. The tension in the leading cutting wire may be in terms of pound-force, which may be communicated as data in terms of voltage or resistance. The tension in the leading cutting wire is assessed with respect to a desired tension range 209. In general, the thicker the cutting wire, the higher the allowable tension. In one example, a cutting wire having a core diameter of 0.160 mm may have an allowable tension range of from about 4.5 lbf to about 14 lbf.

If the tension in the leading cutting wire is below the desired tension range, then the resistance force applied by the trailing resistance device 130 is increased 210. If the tension in the leading cutting wire is above the desired tension range, then the resistance force applied by the trailing resistance device 130 is reduced 211. Such changes in resistance force may be related to motor back torque for control of the trailing motor 131 and may occur incrementally to avoid rapid tension changes that may adversely affect the cutting wire. For example, the resistance force may be adjusted by a percentage of the difference between a nominal or median value of the tension range and the current tension. Thus, resistance force can be adjusted from about 5% to about 25% of the current difference each cycle of the main control loop until the tension is within the desired range. In this way, the trailing resistance device 130 can be actively controlled by tension feedback to maintain tension within a desired range.

If the tension in the leading cutting wire is within the desired range or the tension has been adjusted as described above, then the cycle of the main control loop begins again by determining the cutting speed of the leading cutting wire 204. In general, the main control operates to maintain a constant cutting speed (within an acceptable range) and maintains a desired cutting wire tension level by adjusting resistance (e.g., back torque) on the trailing end of the cutting wire.

The control algorithm can include two additional portions that can be executed. If the tension in the leading cutting wire is within the desired range, then a feed control algorithm can be executed. This portion of the algorithm is illustrated in FIG. 4. The feed control algorithm begins by determining the cutting speed of the leading cutting wire 212, and assessing the cutting speed with respect to a desired cutting speed range 213, as discussed above. Thus, the cutting wire 110 is not advanced unless the tension in the leading cutting wire and the cutting speed are within the desired operating ranges. If the tension and cutting speed are within the desired ranges, then the current wire feed position is determined 214. The current wire feed position is compared to the feed range 215. If the current wire feed position is within the feed range, then the cutting wire is advanced 216. Feed advancement can be any suitable increment, such as about one-third of the diameter of a solder ball 103. If the current wire feed position is at the end of the feed range, then the algorithm ends 217, such as by ceasing all operation of motors.

An interrupt control algorithm can also be executed. This portion of the algorithm is illustrated in FIG. 5. Although the interrupt control algorithm is shown as branching off the main control loop, the interrupt control algorithm can be executed in parallel with the main control loop. The interrupt control algorithm begins by determining the tension in the leading cutting wire 218, as discussed above. Next, the tension in the trailing cutting wire is determined 219. The tension in the trailing cutting wire can be assessed from data received from the trailing tension sensor 150. The difference in tension between the leading and trailing cutting wire portions is then compared to an acceptable margin between the two 220. In one example, an allowable delta tension range can be from about 3 lbf to about 5 lbf. If the margin is exceeded and there is no tension in the leading cutting wire portion, then there is an emergency stop due to a broken cutting wire 221, for example. If the margin is exceeded and the tension in the trailing cutting wire portion is low, then there is an emergency stop due to the cutting wire becoming unspoiled 222, for example. If the margin is exceeded and the tension in the leading cutting wire portion is high, then the cutting wire is retracted or backed up due to binding of the cutting wire 223, for example. The user is prompted to resume operation 224.

Figure 6:
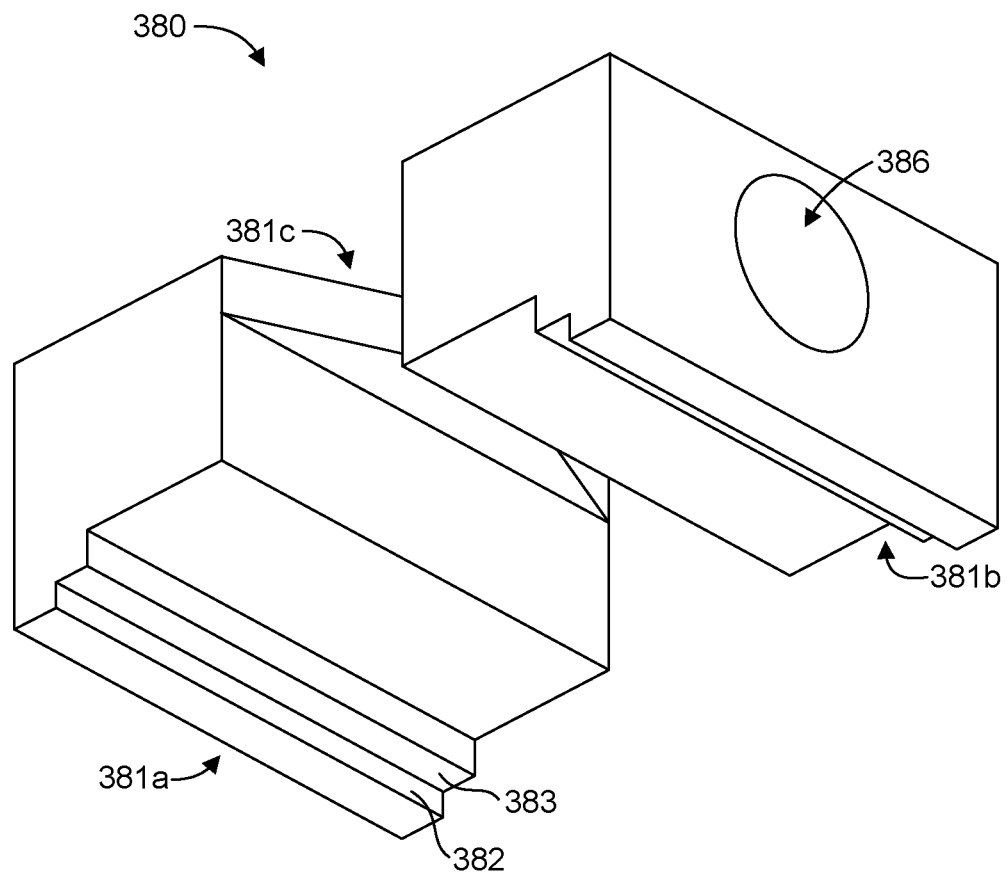
FIG. 6 is a bottom perspective view of an electronic component retainer cap in accordance with an example of the present disclosure.
Figure 7:
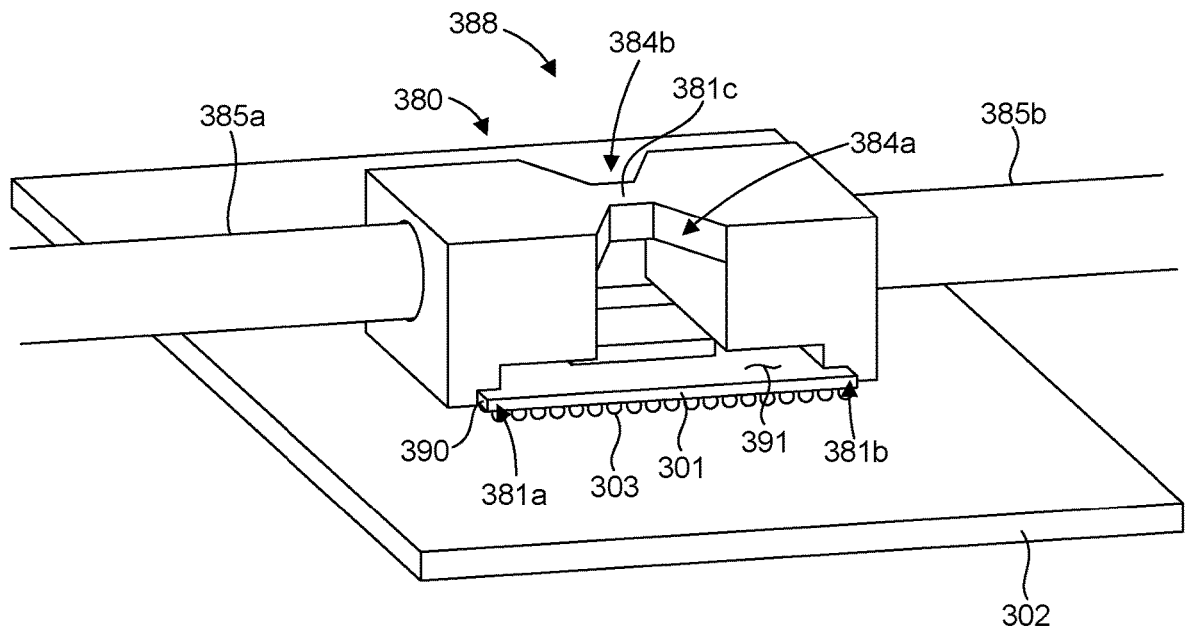
FIG. 7 is a top perspective view of an electronic component retainer with an electronic component and a substrate in accordance with an example of the present disclosure.
Figure 8:
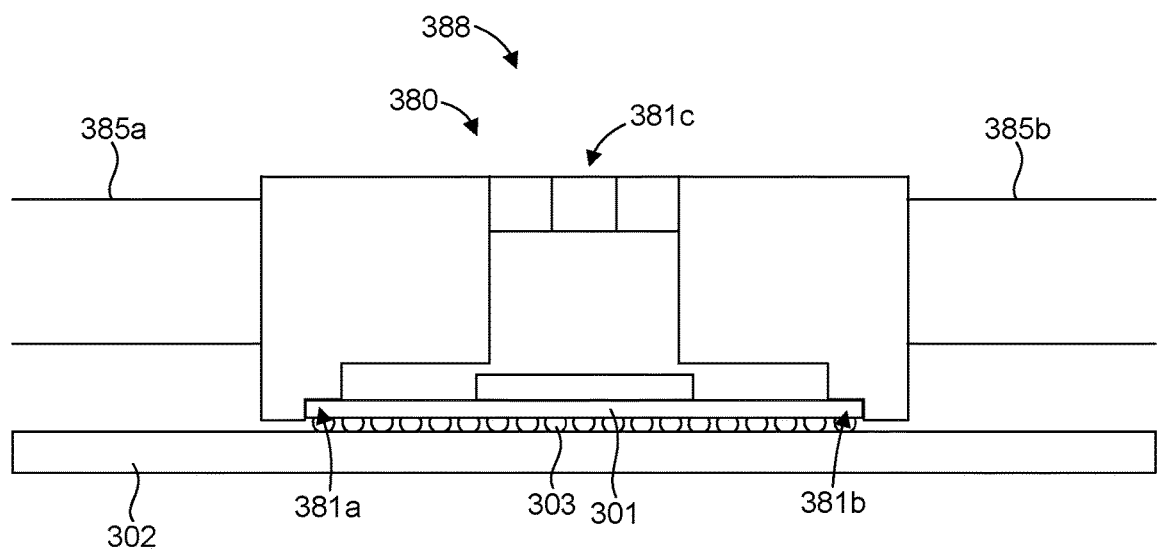
FIG. 8 is a side view of the electronic component retainer of FIG. 7.

FIG. 6 illustrates a bottom perspective view of an electronic component retainer cap 380. The retainer cap 380 can include interface portions 381a, 381b to interface with opposite ends of an electronic component 301, as shown in FIGS. 7 and 8. Each interface portion 381a, 381b can have a vertical interface surface 382 to interface with a side surface 390 of the electronic component 301. Each interface portion 381a, 381b can also have a horizontal interface surface 383 to interface with a top surface 391 of the electronic component 301. Thus, the interface portions 381a, 381b can contact outer perimeter edges and surfaces at opposite (e.g., front and rear) ends of the electronic component 301. A connecting portion 381c can connect the interface portions 381a, 381b. The connecting portion 381c can be recessed 384a, 384b to facilitate visibility of the electronic component 301 from a top side of the electronic component retainer 380.

With reference to FIGS. 6-8, the retainer cap 380 can form an electronic component retainer 388 with one or more supports 385a, 385b coupled to the retainer cap 380. Interface portions 381a, 381b constrain horizontal and vertical movement of the electronic component 301 during removal of the electronic component from a substrate 302. In one aspect, the supports 385a, 385b can comprise two horizontally oriented and aligned rods disposed or supported in a position opposite one another. Each rod can have an end that is captured in respective cavities (e.g., see cavity 386) of the retainer cap 380. The supports 385a, 385b can be threaded to facilitate positioning the retainer cap 388 on the electronic component 301. The supports 385a, 385b can be anchored by a base (not shown) that can have a threaded interface to engage the supports 385a, 385b.

The electronic component 301 may tend to rotate upward during removal from the substrate 302 due to an upward pull of a cutting wire. The interface portions 381a, 381b can contact the electronic component 301 and the supports 385a, 385b can hold the interface portions 381a, 381b in place without clamping or forcing the electronic component 301 toward the substrate 302. This configuration provides horizontal and vertical stabilization that can fully constrain movement of the electronic component 301 during removal from the substrate 302 without compressing and binding the wire cutting through the solder balls 303 between the electronic component 301 and the substrate 302. Such constraint of the electronic component 301 by the electronic component retainer 388 can prevent the electronic component 301 from tearing remaining attachment material and "flying off" the substrate 302 at the final stages of removal, which can prevent damage to the electronic component 301 and the substrate 302.

In accordance with one embodiment of the present invention, a method for removing an electronic component from a substrate is disclosed. The method can comprise moving a leading portion of a cutting wire in a cutting direction at a cutting speed. The method can also comprise applying a resistance force to a trailing portion of the cutting wire. The method can further comprise moving the cutting wire in an advancement direction into an attachment material that couples an electronic component to a substrate. The method can still further comprise determining whether the cutting speed of the leading portion of the cutting wire is within a cutting speed range. The method can even further comprise adjusting the cutting speed to maintain the cutting speed within the cutting speed range. The method can also comprise determining whether a tension in the leading portion of the cutting wire is within a leading wire tension range. Additionally, the method can comprise adjusting the resistance force to maintain the tension in the leading portion of the cutting wire in the leading wire tension range. It is noted that no specific order is required in this method, though generally in one embodiment, these method steps can be carried out sequentially.

In one aspect of the method, adjusting the cutting speed can comprise incrementally reducing or increasing the cutting speed. In another aspect of the method, adjusting the resistance force can comprise incrementally reducing or increasing the resistance force. In one aspect, the cutting wire can be moved in the advancement direction only if the cutting speed is within the cutting speed range and the tension in the leading portion of the cutting wire is within the leading wire tension range. In another aspect, the cutting wire can be incrementally moved in the advancement direction. In one aspect, the method can further comprise determining whether a difference between the tension in the leading portion of the cutting wire and a tension in the trailing portion of the cutting wire exceeds a tension margin, and ceasing movement of the cutting wire in at least one of the cutting direction and the advancement direction if the tension in the leading portion of the cutting wire and the tension in the trailing portion of the cutting wire exceed the tension margin.

Circuitry used in electronic components or devices of a control system can include hardware, firmware, program code, executable code, computer instructions, and/or software. Electronic components and devices can include a non-transitory computer readable storage medium which can be a computer readable storage medium that does not include signal. In the case of program code execution on programmable devices, the programmable devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

It is to be understood that the examples set forth herein are not limited to the particular structures, process steps, or materials disclosed, but are extended to equivalents thereof as would be recognized by those ordinarily skilled in the relevant arts. It should also be understood that terminology employed herein is used for the purpose of describing particular examples only and is not intended to be limiting.

Furthermore, the described features, structures, or characteristics may be combined in any suitable manner in one or more examples. In the description, numerous specific details are provided, such as examples of lengths, widths, shapes, etc., to provide a thorough understanding of the technology being described. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the invention in one or more particular applications, it will be apparent to those of ordinary skill in the art that numerous modifications in form, usage and details of implementation can be made without the exercise of inventive faculty, and without departing from the principles and concepts described herein. Accordingly, it is not intended that the invention be limited, except as by the claims set forth below.

What is claimed is:

1. An electronic component removal device, comprising:
   a cutting wire routed through a cutting region configured to receive an electronic component coupled to a substrate;
   a leading actuator coupled to a leading end of the cutting wire to cause movement of the cutting wire in a cutting direction at a cutting speed through the cutting region;
   a trailing resistance device coupled to a trailing end of the cutting wire to resist movement of the cutting wire in the cutting direction through the cutting region, the trailing resistance device being actuatable to variably control a resistance force applied to the cutting wire; and
   a leading tension sensor operable to sense a leading tension in the cutting wire between the cutting region and the leading actuator,
   wherein the trailing resistance device is actuated based on the leading tension in the cutting wire sensed by the leading tension sensor.

2. The electronic component removal device of claim 1, wherein the cutting wire comprises a diamond abrasive.

3. The electronic component removal device of claim 1, wherein the leading actuator comprises a motor operably coupled to a take-up spool to cause the cutting wire to wind around the take-up spool.

4. The electronic component removal device of claim 3, wherein the leading actuator further comprises a gear train coupling the motor and the take-up spool.

5. The electronic component removal device of claim 1, wherein the trailing resistance device comprises a trailing motor operably coupled to a feed spool, the trailing motor being actuatable to variably control a back-torque applied to the feed spool to resist the cutting wire unwinding from the feed spool.

6. The electronic component removal device of claim 5, wherein the trailing resistance device further comprises a gear train coupling the trailing motor and the feed spool.

7. The electronic component removal device of claim 1, wherein the trailing resistance device comprises a braking mechanism operably coupled to a feed spool, the braking mechanism being actuatable to variably control a braking force applied to the feed spool to resist the cutting wire unwinding from the feed spool.

8. The electronic component removal device of claim 1, wherein the leading tension sensor comprises a force sensor.

9. The electronic component removal device of claim 8, wherein the force sensor comprises an S-type load cell.

10. The electronic component removal device of claim 1, further comprising guide rods to route the cutting wire through the cutting region.

11. The electronic component removal device of claim 10, further comprising a linear translation mechanism operably coupled to the guide rods to cause movement of the cutting wire in an advancement direction through a material that couples the electronic component to the substrate.

12. The electronic component removal device of claim 11, further comprising an advancement actuator to cause movement of the linear translation mechanism.

13. The electronic component removal device of claim 12, further comprising a trailing tension sensor to sense a trailing tension in the cutting wire between the cutting region and the trailing resistance device, wherein movement of the cutting wire in at least one of the cutting direction and the advancement direction is ceased if a difference between the leading tension and the trailing tension in the cutting wire exceeds a tension margin.

14. The electronic component removal device of claim 13, wherein the trailing tension sensor comprises a force sensor.

15. The electronic component removal device of claim 14, wherein the force sensor comprises an S-type load cell.

16. The electronic component removal device of claim 1, further comprising a control system having a processor and memory to control operation of the trailing resistance device based on data from the leading tension sensor.

* * * * *